United States Patent
Hwang

(10) Patent No.: US 9,001,598 B2
(45) Date of Patent: Apr. 7, 2015

(54) SEMICONDUCTOR DEVICES AND SEMICONDUCTOR SYSTEMS INCLUDING THE SAME

(71) Applicant: SK Hynix Inc., Icheon-si Gyeonggi-do (KR)

(72) Inventor: Jeong Tae Hwang, Icheon-si Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 68 days.

(21) Appl. No.: 14/041,563

(22) Filed: Sep. 30, 2013

(65) Prior Publication Data

US 2014/0298071 A1      Oct. 2, 2014

(30) Foreign Application Priority Data

Apr. 2, 2013   (KR) .................. 10-2013-0035768

(51) Int. Cl.
    *G11C 7/22*       (2006.01)
    *G06F 1/12*       (2006.01)
    *G11C 16/10*      (2006.01)

(52) U.S. Cl.
    CPC  *G06F 1/12* (2013.01); *G11C 16/10* (2013.01); *G11C 7/22* (2013.01)

(58) Field of Classification Search
    CPC .............. G06F 1/12; G11C 7/22; G11C 7/24; G11C 16/10; G11C 16/105; G11C 16/06

USPC .................. 365/191, 185.02, 185.23, 189.16
    See application file for complete search history.

(56) References Cited

U.S. PATENT DOCUMENTS

| 6,041,013 A * | 3/2000 | Kohno ..................... 365/230.03 |
| 2002/0048193 A1 | 4/2002 | Tanikawa et al. |
| 2005/0249004 A1* | 11/2005 | Seo ................................ 365/205 |

FOREIGN PATENT DOCUMENTS

KR   1020110127615 A   11/2011

* cited by examiner

*Primary Examiner* — Tan T. Nguyen
(74) *Attorney, Agent, or Firm* — William Park & Associates Patent Ltd.

(57) ABSTRACT

A semiconductor device including an internal command generator and a bias generator is provided. The internal command generator generates first to fourth internal command signals sequentially enabled in synchronization with pulses of an external program signal. The first internal command signal controls a read operation for reading out data stored in memory cells, and the second and third internal command signals control a program operation for programming the memory cells. The bias generator generates a read bias signal for controlling a level of an output voltage signal, which is applied to an internal circuit, in response to the first and fourth internal command signals.

21 Claims, 4 Drawing Sheets

FIG.3

| CNT2 | CNT1 | IRD | PGMEN | PGMDIS | RBC |
|------|------|-----|-------|--------|-----|
| L | L | H | L | L | L |
| L | H | L | H | L | L |
| H | L | L | L | H | L |
| H | H | L | L | L | H |

SEMICONDUCTOR DEVICES AND SEMICONDUCTOR SYSTEMS INCLUDING THE SAME

CROSS-REFERENCE TO RELATED APPLICATION

The present application claims priority under 35 U.S.C 119(a) to Korean Application No. 10-2013-0035768, filed on Apr. 2, 2013, in the Korean Intellectual Property Office, which is incorporated herein by reference in its entirety as set forth in full.

BACKGROUND

1. Technical Field

Embodiments of the present disclosure generally relate to a semiconductor system, and more particularly, to program and read operations.

2. Related Art

Electrically erasable programmable read only memory (EEPROM) devices are nonvolatile memory devices whose data can be erased using an electric bias instead of an ultraviolet (UV) light source. Each of the EEPROM devices may include a plurality of memory cells, and each of the memory cells may include a floating gate that is electrically insulated. A logic level of the data stored in the memory cell can be discriminated according to whether the floating gate contains electric charges or not. In general, a memory cell including the floating gate (hereinafter, referred to as a floating gate memory cell) is formed in and on an integrated circuit (IC) substrate such as a semiconductor substrate. For example, the floating gate memory cell is formed to include source and drain regions spaced apart from each other as well as the floating gate disposed on a channel region between the source and drain regions. The floating gate may be formed of a doped polysilicon layer and may be electrically insulated from other cell components by a dielectric material such as an oxide layer. A gate oxide layer may be disposed between the channel region and the floating gate. Further, a control gate may be disposed on a top surface of the floating gate opposite to the channel region and may be formed of a doped polysilicon layer. The control gate may be electrically insulated from the floating gate by another dielectric layer so called 'an inter-gate dielectric layer'. As a result, the floating gate may be electrically insulated from the channel region and the control gate. Electric charges are injected into or removed from the floating gate during a program operation or an erasure operation. Other nonvolatile memory devices may include polymer memory devices, ferroelectric RAM (FeRAM) devices, Ovonics unified memory (OUM) device (also, known as 'phase change random access memory (PCRAM) devices') and magnetic RAM (MRAM) devices.

The nonvolatile memory devices may further include flash memory devices. In general, each of the flash memory devices may include a memory array having a plurality of flash memory cells. Each of the flash memory cells may include a floating gate or a charge trapping layer which is buried in a field effect transistor (FET). The flash memory cells may be grouped into a plurality of sections which are also referred to as 'erasure blocks'. The floating gate memory cells may be individually programmed by injecting electric charges (e.g., negative charges) into the corresponding floating gate using a tunneling effect. All the floating gate memory cells in each erasure block may be simultaneously erased by removing the negative charges stored in the floating gates thereof during a block erasure operation. In recent flash memory devices employing the non-conductive charge strapping layers, a single memory cell can be programmed to have multi-bit data by injecting electric charges into portions of the non-conductive charge trapping layers adjacent to the source regions and/or the drain regions. Further, in recent flash memory devices employing the floating gates, a single memory cell can be programmed to have multi-bit data by determining a plurality of critical charge levels of each memory cell.

In general, a single row (e.g., a single page) of memory cells of the flash memory devices may be programmed by applying a program voltage signal or a series of program pulse signals to a control gate.

SUMMARY

Various embodiments are directed to semiconductor devices and semiconductor systems including the same.

According to some embodiments, a semiconductor device includes an internal command generator and a bias generator. The internal command generator is configured to generate first to fourth internal command signals sequentially enabled in synchronization with pulses of an external program signal. The first internal command signal controls a read operation for reading out data stored in memory cells, and the second and third internal command signals control a program operation for programming the memory cells. The bias generator is configured to generate a read bias signal for controlling a level of an output voltage signal, which is applied to an internal circuit, in response to the first and fourth internal command signals.

According to further embodiments, a semiconductor device includes an internal command generator, a read controller and a control signal generator. The internal command generator is configured to generate a first internal command signal enabled when a first pulse of an external program signal is applied thereto and to generate a second internal command signal enabled when a second pulse of the external program signal is applied thereto. The read controller is configured to execute a read operation to output data stored in memory cells as a read data when the first internal command signal is enabled. The control signal generator is configured to generate a program control signal which is enabled for a program operation when the read data has a different level from an external data and the second internal command signal is enabled.

According to further embodiments, a semiconductor system includes a semiconductor controller and a semiconductor device. The semiconductor controller is configured to generate an external program signal and an external data, and the semiconductor device is configured to receive the external program signal and the external data to generate first to fourth internal command signals which are sequentially enabled whenever pulses of the external program signal are inputted. The first internal command signal controls a read operation for reading out data stored in memory cells, and the second and third internal command signals control a program operation for programming the memory cells. The first and fourth internal command signals control an enablement of a read bias signal for controlling a level of an output voltage signal which is applied to an internal circuit.

According to an embodiment, a memory system includes a memory controller and a semiconductor device, the semiconductor device including an internal command generator configured to generate first to fourth internal command signals sequentially enabled in synchronization with pulses of an external program signal, the first internal command signal controlling a read operation for reading out data stored in memory cells and the second and third internal command signals controlling a program operation for programming the memory cells; and a bias generator configured to generate a read bias signal for controlling a level of an output voltage signal, which is applied to an internal circuit, in response to the first and fourth internal command signals.

BRIEF DESCRIPTION OF THE DRAWINGS

Embodiments of the inventive concept will become more apparent in view of the attached drawings and accompanying detailed description, in which:

FIG. 3 is a logic table illustrating an operation of the internal command generator shown in FIG. 2.

DETAILED DESCRIPTION OF THE EMBODIMENTS

Various embodiments of the inventive concept will be described hereinafter with reference to the accompanying drawings. However, the various embodiments described herein are for illustrative purposes only and are not intended to limit the scope of the inventive concept.

Figure 1:
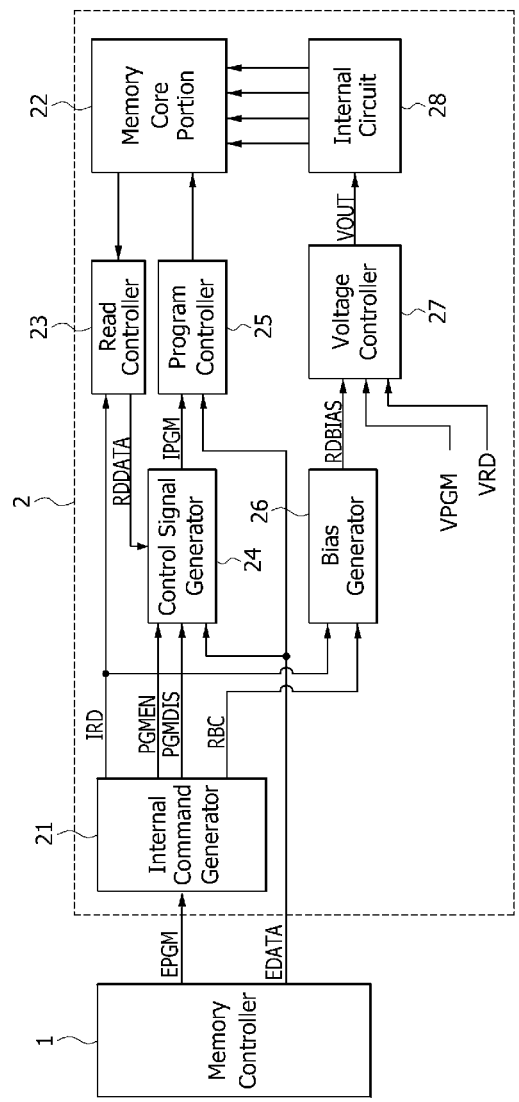
FIG. 1 is a block diagram illustrating a configuration of a semiconductor system according to some embodiments.

Referring to FIG. 1, a semiconductor system according to some embodiments may be configured to include a memory controller 1 and a semiconductor device 2. The memory controller 1 may generate an external program signal EPGM and external data EDATA. The semiconductor device 2 may receive the external program signal EPGM and the external data EDATA to generate a first internal command signal IRD, a second internal command signal PGMEN, a third internal command signal PGMDIS and a fourth internal command signal RBC which may be sequentially enabled whenever pulses of the external program signal EPGM are inputted. Further, the semiconductor device 2 may execute a read operation in response to the first internal command signal IRD and may execute a program operation in response to the second and third internal command signals PGMEN and PGMDIS. Moreover, the semiconductor device 2 may control a voltage level, which is supplied to an internal circuit therein during the read operation and the program operation, in synchronization with the first and fourth internal command signals IRD and RBC.

The semiconductor device 2 may be configured to include an internal command generator 21, a memory core portion 22, a read controller 23, a control signal generator 24, a program controller 25, a bias generator 26, a voltage controller 27 and an internal circuit 28.

The internal command generator 21 may receive the external program signal EPGM outputted from the memory controller 1 to generate the first to forth internal command signals IRD, PGMEN, PGMDIS and RBC. In more detail, the internal command generator 21 may generate the first internal command signal IRD which may be enabled in response to a first pulse of the external program signal EPGM, may generate the second internal command signal PGMEN which may be enabled in response to a second pulse of the external program signal EPGM, may generate the third internal command signal PGMDIS which may be enabled in response to a third pulse of the external program signal EPGM, and may generate the fourth internal command signal RBC which may be enabled in response to a fourth pulse of the external program signal EPGM. A detailed configuration and a detailed operation of the internal command generator 21 will be described with reference to FIGS. 2 and 3 later.

The read controller 23 may output data stored in memory cells included in the memory core portion 22 as read data RDDATA when the first internal command signal IRD is enabled. When the first internal command signal IRD is generated to have a pulse corresponding to an enabled period, the pulse of the first internal command signal IRD may be set to have a different width according to embodiments.

The control signal generator 24 may receive the external data EDATA outputted from the memory controller 1 and may generate a program control signal IPGM in response to the second and third internal command signals PGMEN and PGMDIS. Specifically, the control signal generator 24 may generate the program control signal IPGM which may be enabled when the second internal command signal PGMEN is enabled and the read data RDDATA has a different level from the external data EDATA. In contrast, the control signal generator 24 may generate the program control signal IPGM having a disabled state when the second internal command signal PGMEN is enabled and the read data RDDATA has the same level as the external data EDATA. In addition, the control signal generator 24 may generate the program control signal IPGM which may be disabled when the third internal command signal PGMDIS is enabled. When each of the second and third internal command signals PGMEN and PGMDIS is generated to have a pulse corresponding to an enabled period, the pulse of each of the second and third internal command signals PGMEN and PGMDIS may be set to have a different width according to embodiments. The program control signal IPGM may be enabled to have a logic "high" level or a logic "low" level according to embodiments.

The program controller 25 may transmit the external data EDATA outputted from the memory controller 1 into the corresponding memory cells of the memory core portion 22 to program the semiconductor device 2 when the program control signal IPGM is enabled.

The bias generator 26 may generate a read bias signal RDBIAS in response to the first and fourth internal command signals IRD and RBC. In more detail, the bias generator 26 may generate the read bias signal RDBIAS which may be enabled during a predetermined period if the first internal command signal IRD is enabled. Further, the bias generator 26 may generate the read bias signal RDBIAS which may be enabled if the fourth internal command signal RBC is enabled. A period that the read bias signal RDBIAS enabled by the fourth internal command signal RBC may vary according to embodiments. When the fourth internal command signal RBC is generated to have a pulse defining an enabled period, the pulse of the fourth internal command signal RBC may be set to have a different width according to embodiments. The read bias signal RDBIAS may be enabled to have a logic "high" level or a logic "low" level according to embodiments.

The voltage controller 27 may output a read voltage signal VRD as an output voltage signal VOUT applied to the internal circuit 28 from a point of time that the read bias signal RDBIAS is enabled by the first internal command signal IRD. The voltage controller 27 may output a program voltage signal VPGM as the output voltage signal VOUT after a predetermined period elapses from the point of time that the read bias signal RDBIAS is enabled by the first internal command signal IRD. The voltage controller 27 may again output the read voltage signal VRD as the output voltage signal VOUT when the read bias signal RDBIAS is enabled by the fourth internal command signal RBC. In the present embodiments///, the program voltage signal VPGM may be set to have a higher level than the read voltage signal VRD. The internal circuit 28 may be a circuit that transmits the output voltage signal VOUT to word lines (e.g., control gates) or bit lines disposed in the memory core portion 22 and may decode a row address signal or a column address signal.

Figure 2:
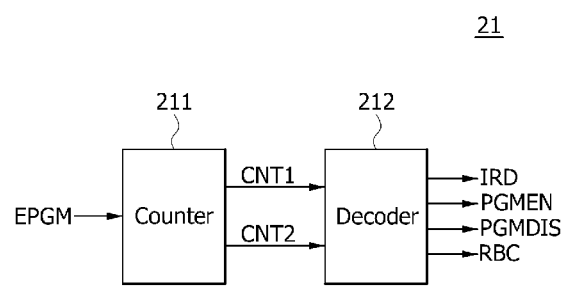
FIG. 2 is a block diagram illustrating a configuration of an internal command generator included in the semiconductor system of FIG. 1.

Referring to FIG. 2, the internal command generator 21 may be configured to include a counter 211 and a decoder 212. The counter 211 may generate a first count signal CNT1 and a second count signal CNT2 which may be counted up by one bit whenever the pulses of the external program signal EPGM are applied to the counter 211. The decoder 212 may decode the first and second count signals CNT1 and CNT2 to generate the first to fourth internal command signals IRD, PGMEN, PGMDIS and RBC which may be selectively enabled according to a level combination of the first and second count signals CNT1 and CNT2.

Referring to FIG. 3, it may be understood that the first to fourth internal command signals IRD, PGMEN, PGMDIS and RBC may be sequentially enabled according to the number of pulses of external program signal EPGM applied to the internal command generator 21. For example, when the first pulse of the external program signal EPGM is applied to the internal command generator 21, the internal command generator 21 may generate the first and second count signals CNT1 and CNT2 having a level combination (L, L) to output the first internal command signal IRD enabled to have a logic "high" level. The level combination (L, L) means that both the first and second count signals CNT1 and CNT2 have a logic "low" level. When the second pulse of the external program signal EPGM is applied to the internal command generator 21, the internal command generator 21 may generate the first and second count signals CNT1 and CNT2 having a level combination (L, H) to output the second internal command signal PGMEN enabled to have a logic "high" level (i.e., H). The level combination (L, H) means that the first count signal CNT1 has a logic "high" level and the second count signal CNT2 has a logic "low" level. When the third pulse of the external program signal EPGM is applied to the internal command generator 21, the internal command generator 21 may generate the first and second count signals CNT1 and CNT2 having a level combination (H, L) to output the third internal command signal PGMDIS enabled to have a logic "high" level. The level combination (H, L) means that the first count signal CNT1 has a logic "low" level and the second count signal CNT2 has a logic "high" level. When the fourth pulse of the external program signal EPGM is applied to the internal command generator 21, the internal command generator 21 may generate the first and second count signals CNT1 and CNT2 having a level combination (H, H) to output the fourth internal command signal RBC enabled to have a logic "high" level. The level combination (H, H) means that both the first and second count signals CNT1 and CNT2 have a logic "high" level.

Hereinafter, an operation of the semiconductor system as set forth above will be described with reference to FIG. 4.

Figure 4:
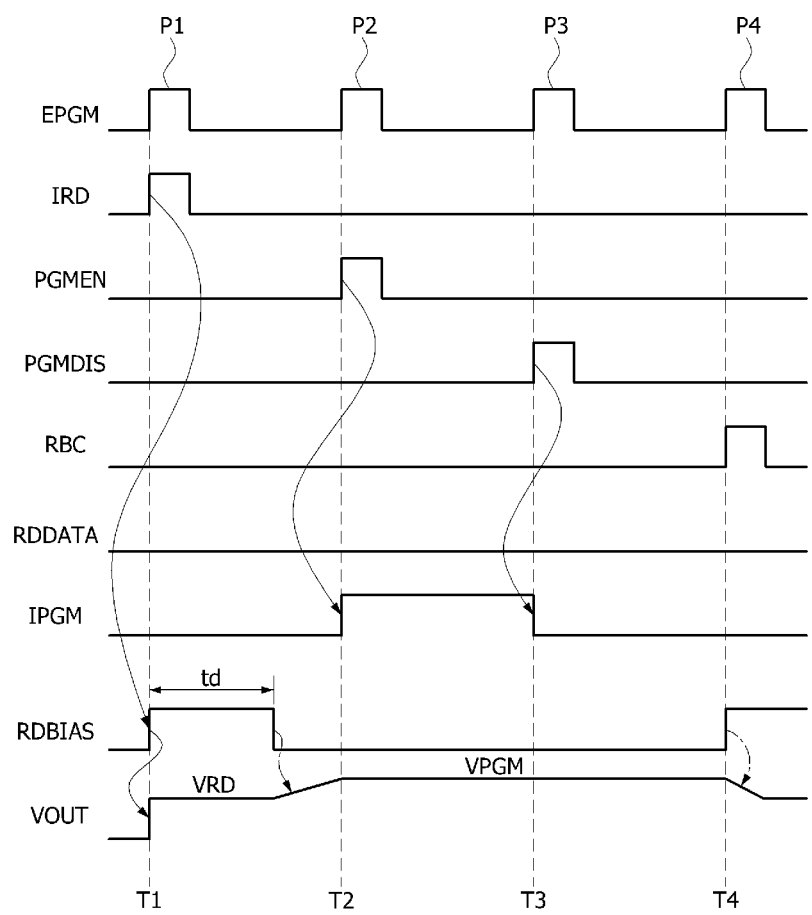
FIG. 4 is a timing diagram illustrating an operation of the semiconductor system shown in FIG. 1.

Referring to FIG. 4, if the first pulse P1 of the external program signal EPGM is applied to the semiconductor device 2 at a point of time T1, the first internal command signal IRD may be enabled to have a pulse. If the first internal command signal IRD is enabled, the data stored in the memory cells of the memory core portion 22 may be outputted as the read data RDDATA. Further, if the first internal command signal IRD is enabled by the first pulse P1, the read bias signal RDBIAS may be generated to be enabled during a predetermined period Td from the point of time T1 and the output voltage signal VOUT may be generated to have a level of the read voltage signal VRD at the point of time T1. The read bias signal RDBIAS may be disabled after the predetermined period Td elapses from the point of time T1, and the output voltage signal VOUT may be generated to have a level of the program voltage signal VPGM after the read bias signal RDBIAS is disabled. That is, the output voltage signal VOUT having the level of the read voltage signal VRD may increase along a uniform slope to reach the level of the program voltage signal VPGM.

Next, if the second pulse P2 of the external program signal EPGM is applied to the semiconductor device 2 at a point of time T2, the second internal command signal PGMEN may be enabled to have a pulse. In such a case, if the external data EDATA has a logic "high" level, the program control signal IPGM may be enabled to have a logic "high" level because the external data EDATA has a different level from the read data RDDATA which is outputted to have a logic "low" level during a previous read operation. Thus, while the program control signal IPGM is enabled, the external data EDATA may be transmitted to the memory cells in the memory core portion 22 to program the semiconductor device 2.

Next, if the third pulse P3 of the external program signal EPGM is applied to the semiconductor device 2 at a point of time T3, the third internal command signal PGMDIS may be enabled to have a pulse. If third internal command signal PGMDIS is enabled, the program control signal IPGM may be disabled to have a logic "low" level to terminate the program operation.

Finally, if the fourth pulse P4 of the external program signal EPGM is applied to the semiconductor device 2 at a point of time T4, the fourth internal command signal RBC may be enabled to have a pulse. If the fourth internal command signal RBC is enabled, the read bias signal RDBIAS may be again enabled and the output voltage signal VOUT may be generated to have the level of the read voltage signal VRD. That is, the output voltage signal VOUT having the level of the program voltage signal VPGM may decrease along a negative uniform slope to reach the level of the read voltage signal VRD.

Various embodiments of the inventive concept have been disclosed above for illustrative purposes. Those skilled in the art will appreciate that various modifications, additions and substitutions are possible, without departing from the scope and spirit of the inventive concept as disclosed in the accompanying claims.

What is claimed is:
1. A semiconductor device comprising:
   an internal command generator configured to generate first to fourth internal command signals sequentially enabled in synchronization with pulses of an external program signal, the first internal command signal controlling a read operation for reading out data stored in memory cells and the second and third internal command signals controlling a program operation for programming the memory cells; and
   a bias generator configured to generate a read bias signal for controlling a level of an output voltage signal, which is applied to an internal circuit, in response to the first and fourth internal command signals.
2. The semiconductor device of claim 1:
   wherein the first internal command signal is enabled in response to a first pulse of the external program signal;

wherein the second internal command signal is enabled in response to a second pulse of the external program signal;

wherein the third internal command signal is enabled in response to a third pulse of the external program signal; and wherein the fourth internal command signal is enabled in response to a fourth pulse of the external program signal EPGM.

3. The semiconductor device of claim 1, further comprising:

a read controller configured to execute the read operation to output data stored in the memory cells as a read data when the first internal command signal is enabled.

4. The semiconductor device of claim 3, further comprising:

a program controller configured to transmit external data that is inputted into the memory cells when the second internal command signal is enabled and the read data has a different level from the external data.

5. The semiconductor device of claim 3, further comprising:

a control signal generator configured to generate a program control signal which is enabled for the program operation when the read data has a different level from an external data and the second internal command signal is enabled.

6. The semiconductor device of claim 5, wherein the control signal generator is configured to generate the program control signal which is disabled when the third internal command signal is enabled.

7. The semiconductor device of claim 1, further comprising:

a voltage controller configured to output a read voltage signal as the output voltage signal during a predetermined period from a point of time that the read bias signal is enabled in synchronization with the first internal command signal and to output a program voltage signal as the output voltage signal after the predetermined period elapses from the point of time that the read bias signal is enabled in synchronization with the first internal command signal.

8. The semiconductor device of claim 7, wherein the voltage controller is configured to output the read voltage signal as the output voltage signal from a point of time that the read bias signal is enabled in synchronization with the fourth internal command signal.

9. A semiconductor device comprising:

an internal command generator configured to generate a first internal command signal enabled when a first pulse of an external program signal is applied thereto and to generate a second internal command signal enabled when a second pulse of the external program signal is applied thereto;

a read controller configured to execute a read operation to output data stored in memory cells as a read data when the first internal command signal is enabled; and a control signal generator configured to generate a program control signal which is enabled for a program operation when the read data has a different level from an external data and the second internal command signal is enabled.

10. The semiconductor device of claim 9, wherein the internal command generator is configured to generate a third internal command signal which is enabled when a third pulse of the external program signal is applied thereto.

11. The semiconductor device of claim 10, wherein the control signal generator is configured to generate the program control signal which is disabled when the third internal command signal is enabled.

12. The semiconductor device of claim 9, wherein the internal command generator is configured to generate a fourth internal command signal which is enabled when a fourth pulse of the external program signal is applied thereto.

13. The semiconductor device of claim 12, further comprising:

a bias generator configured to generate a read bias signal for controlling a level of an output voltage signal, which is applied to an internal circuit, in response to the first and fourth internal command signals.

14. The semiconductor device of claim 13, further comprising:

a voltage controller configured to output a read voltage signal as the output voltage signal during a predetermined period from a point of time that the read bias signal is enabled in synchronization with the first internal command signal and to output a program voltage signal as the output voltage signal after the predetermined period elapses from the point of time that the read bias signal is enabled in synchronization with the first internal command signal.

15. The semiconductor device of claim 14, wherein the voltage controller is configured to output the read voltage signal as the output voltage signal from a point of time that the read bias signal is enabled in synchronization with the fourth internal command signal.

16. A semiconductor system comprising:

a semiconductor controller configured to generate an external program signal and an external data; and a semiconductor device configured to receive the external program signal and the external data to generate first to fourth internal command signals which are sequentially enabled whenever pulses of the external program signal are inputted, wherein the first internal command signal controls a read operation for reading out data stored in memory cells, the second and third internal command signals control a program operation for programming the memory cells, and the first and fourth internal command signals control an enablement of a read bias signal for controlling a level of an output voltage signal which is applied to an internal circuit.

17. The semiconductor system of claim 16:

wherein the first internal command signal is enabled in response to a first pulse of the external program signal;

wherein the second internal command signal is enabled in response to a second pulse of the external program signal;

wherein the third internal command signal is enabled in response to a third pulse of the external program signal; and wherein the fourth internal command signal is enabled in response to a fourth pulse of the external program signal EPGM.

18. The semiconductor system of claim 17, wherein the semiconductor device includes a read controller that executes the read operation to output the data stored in the memory cells as a read data when the first internal command signal is enabled.

19. The semiconductor system of claim 18, wherein the semiconductor device further includes a control signal generator that generates a program control signal which is enabled for the program operation when the read data has a different level from the external data and the second internal command signal is enabled.

20. The semiconductor system of claim 19, wherein the control signal generator is configured to generate the program control signal which is disabled when the third internal command signal is enabled.

21. The semiconductor system of claim 17:
wherein the semiconductor device further includes a voltage controller; and
wherein the voltage controller is configured to output a read voltage signal as the output voltage signal during a predetermined period from a point of time that the read bias signal is enabled in synchronization with the first internal command signal, to output a program voltage signal as the output voltage signal after the predetermined period elapses from the point of time that the read bias signal is enabled, and to output the read voltage signal as the output voltage signal from a point of time that the read bias signal is enabled in synchronization with the fourth internal command signal.

\* \* \* \* \*